United States Patent
Goli et al.

(10) Patent No.: US 11,901,864 B1
(45) Date of Patent: Feb. 13, 2024

(54) READOUT CIRCUIT WITH CHARGE DUMP CIRCUIT

(71) Applicant: TEXAS INSTRUMENTS INCORPORATED, Dallas, TX (US)

(72) Inventors: Sravana Kumar Goli, Bangalore (IN); Nagesh Surendranath, Dallas, TX (US); Saugata Datta, Bangalore (IN); Sandeep Oswal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/088,951

(22) Filed: Dec. 27, 2022

(51) Int. Cl.
| | | |
|---|---|---|
| *H03B 5/12* | (2006.01) | |
| *H03M 7/12* | (2006.01) | |
| *G01J 1/42* | (2006.01) | |
| *H03K 5/24* | (2006.01) | |
| *H03L 7/081* | (2006.01) | |
| *G01S 17/894* | (2020.01) | |

(52) U.S. Cl.
CPC .............. *H03B 5/1243* (2013.01); *G01J 1/42* (2013.01); *G01S 17/894* (2020.01); *H03K 5/24* (2013.01); *H03L 7/0812* (2013.01); *H03M 7/12* (2013.01)

(58) Field of Classification Search
CPC ....... H03K 5/24; G01S 17/894; H03L 7/0812; H03B 5/1243; H03M 7/12; G01J 1/42
USPC ........... 348/372, 308; 341/155; 327/143, 51, 327/514, 515; 250/206, 208.2, 370.09; 382/305, 312
See application file for complete search history.

(56) References Cited

U.S. PATENT DOCUMENTS

| | | | |
|---|---|---|---|
| 2006/0131484 A1* | 6/2006 | Peting ..................... | H04N 3/155 250/214 R |
| 2020/0014297 A1* | 1/2020 | Louwsma ............ | H04N 25/772 |
| 2022/0392512 A1* | 12/2022 | Johansson ........... | G11C 11/4076 |

* cited by examiner

*Primary Examiner* — Arnold M Kinkead
(74) *Attorney, Agent, or Firm* — Valerie M. Davis; Frank D. Cimino

(57) ABSTRACT

A circuit includes an amplifier having an input and an output. A voltage comparator has an input and first and second outputs. The input of the voltage comparator is coupled to the output of the amplifier. A variable capacitor circuit is coupled between the input and the output of the amplifier and is coupled to the first output of the voltage comparator. A charge dump circuit has an input and an output. The input of the charge dump circuit is coupled to the second output of the voltage comparator. The output of the charge dump circuit is coupled to the input of the amplifier.

20 Claims, 7 Drawing Sheets

READOUT CIRCUIT WITH CHARGE DUMP CIRCUIT

BACKGROUND

Many electronic devices (e.g., cell phones, cameras, etc.) include an imaging device with image sensors that convert incident electromagnetic radiation, e.g., light, to electrical signals, such as currents or voltages, that may be represented as digital images. The image sensors may include photodiodes which each convert incident electromagnetic radiation into photocurrent that may be output into a readout circuit for digital signal processing and display. The electronic devices may also include the readout circuits, which convert the signals from the image sensors into digital signals that represent the digital images.

SUMMARY

A circuit includes an amplifier having an input and an output. A voltage comparator has an input and first and second outputs. The input of the voltage comparator is coupled to the output of the amplifier. A variable capacitor circuit is coupled between the input and the output of the amplifier and is coupled to the first output of the voltage comparator. A charge dump circuit has an input and an output. The input of the charge dump circuit is coupled to the second output of the voltage comparator. The output of the charge dump circuit is coupled to the input of the amplifier.

An electronic system includes an imaging device configured to provide a signal, a back-end readout circuit configured to generate a digital signal from an output voltage; and a circuit coupled between the imaging device and the back-end readout circuit. The circuit is configured to generate the output voltage based on the signal from the imaging device. The circuit includes an amplifier having an input and an output. A variable capacitor circuit is coupled between the input and the output of the amplifier. The variable capacitor circuit has a first capacitor and a second capacitor coupled in parallel with one another between the input and the output of the amplifier. A voltage comparator has a first input and a first output. The first input of the voltage comparator is coupled to the output of the amplifier. A charge dump circuit has an input and an output. The input of the charge dump circuit is coupled to the first output of the voltage comparator. The output of the charge dump circuit is coupled to the input of the amplifier.

A method is also described. In the method an input signal, which has an input charge/current level, is received at an amplifier. An output voltage is output from the amplifier based on the input signal. The method further includes detecting whether a first voltage drop has occurred by determining whether the output voltage drops below a first threshold voltage. Next, it is detected whether a second voltage drop has occurred by determining whether the output voltage drops below a second threshold voltage after the first voltage drop has occurred. The first threshold voltage is less than the second threshold voltage. Based on whether the second voltage drop has occurred, the input charge level of the input signal is changed by a charge value.

DETAILED DESCRIPTION

The following description provides different examples for implementing features of the provided subject matter. Specific examples of components and arrangements are described below to simplify the present description. The drawings are not drawn to scale.

Figure 1:
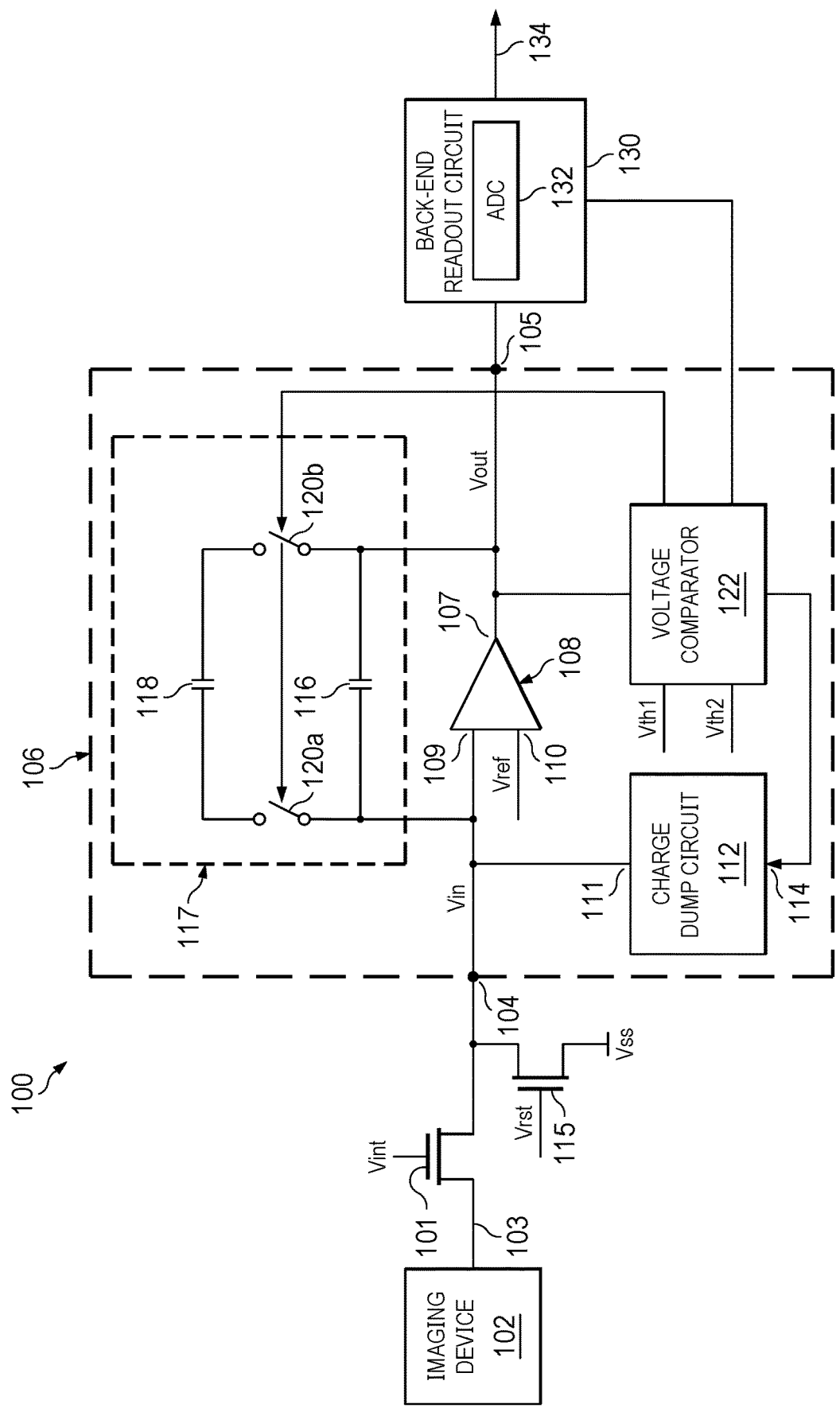
FIG. 1 illustrates a block diagram of an example electronic system including a dynamic gain circuit.

FIG. 1 depicts an example electronic system 100. The electronic system 100 includes an imaging device 102, a transfer transistor 101, a reset transistor 115, a dynamic gain circuit 106, and a back-end readout circuit 130. The dynamic gain circuit 106 includes an amplifier 108, a variable capacitor 117, a charge dump circuit 112, and a voltage comparator 122. The back-end readout circuit 130 includes an analog-to-digital (ADC) converter 132.

In some examples, the transfer transistor 101 and the reset transistor 115 are field-effect transistors (FETs), bipolar junction transistors (BJTs), junction field effect transistors (JFETs), or the like. A control terminal of the transfer transistor 101 is coupled to an imaging control circuit (not shown) that provides an integration signal, for example an integration voltage Vint. Further, a control terminal of the reset transistor 115 is coupled to the imaging control circuit (not shown) that provides a reset signal, for example a reset voltage Vrst.

The amplifier 108 of the dynamic gain circuit 106 has a first amplifier input 109, a second amplifier input 110, and an amplifier output 107. The amplifier input 109 corresponds to an input 104 of the dynamic gain circuit 106, and the amplifier input 110 is coupled to a voltage reference circuit (not shown) to receive a reference voltage Vref. The amplifier output 107 corresponds to an output 105 of the dynamic gain circuit 106.

The variable capacitor 117 of the dynamic gain circuit 106 is coupled between the output 107 and the input 109 of the amplifier 108. The variable capacitor 117 includes a (first) feedback capacitor 116, a (second) feedback capacitor 118, a (first) switching device (or switch) 120a, and a (second) switching device 120b. For example, the switching devices 120a, 120b are transistors, such as FETs or BJTs. The switching device 120a and the switching device 120b are arranged to selectively couple the feedback capacitor 118 in parallel with the feedback capacitor 116 responsive to a control signal from the voltage comparator 122. The variable capacitor 117 may include additional capacitors and corresponding switches to couple the additional capacitors in parallel with the feedback capacitor 116. Also, the variable capacitor 117 may include switching devices to couple the feedback capacitor 116 between the output 107 and the input 109 of the amplifier 108 responsive to a control signal from the voltage comparator 122.

The charge dump circuit 112 includes a charge dump input 114 coupled to the voltage comparator 122 and a charge dump output 111 coupled to the amplifier input 109. The voltage comparator 122 has a first input coupled to the amplifier output 107, a second input coupled to a voltage supply (not shown) that provides a (first) threshold voltage Vth1, and a third input coupled to a voltage supply (not shown) that provides a (second) threshold voltage Vth2. Further, the voltage comparator 122 has a first output coupled to control terminals of the switching devices 120a, 120b, a second output coupled to the charge dump input 114, and a third output coupled to the back-end readout circuit 130.

The transfer transistor 101 is coupled between the imaging device 102 and the input 104 of the dynamic gain circuit 106. More particularly, an output of the imaging device 102 is coupled to a first terminal of the transistor 101, and a second terminal of the transistor 101 is coupled to the input 104 of the dynamic gain circuit 106. A control terminal of the transfer transistor 101 is coupled to the imaging control circuit (not shown) that provides an integration signal, for example an integration voltage Vint.

The reset transistor 115 has a first terminal coupled to the input 104 of the dynamic gain circuit 106 and a second terminal coupled to a voltage supply (not shown) that provides a supply voltage Vss. Further, a control terminal of the reset transistor 115 is coupled to the imaging control circuit (not shown) that provides a reset signal, for example a reset voltage Vrst.

The feedback capacitor 116 has a first terminal coupled to the amplifier input 109 and a second terminal coupled to the amplifier output 107. The switching device 120a has a first terminal coupled to the amplifier input 109 and a second terminal coupled to a first terminal of the feedback capacitor 118. The switching device 120b has a first terminal coupled to the amplifier output 107 and a second terminal coupled to a second terminal of the feedback capacitor 118. Control terminals of the switching devices 120a, 120b are coupled to the first output of the voltage comparator 122.

The back-end readout circuit 130 includes the ADC 132. Further, the back-end readout circuit 130 has a first input coupled to the output 105 of the dynamic gain circuit 106, a second input coupled to the third output of the voltage comparator 122, and an output that provides a multi-bit digital signal 134.

The imaging device 102 may include one or more photodiodes and be part of a computed tomography (CT) system, an X-ray system, a cell phone, a digital camera, etc. Accordingly, the imaging device 102 absorbs electromagnetic radiation (e.g., photons) and generates a signal 103 that corresponds to or represents the absorbed electromagnetic radiation. For example, the signal 103 is a photocurrent from one or more of the photodiodes of the imaging device 102.

Responsive to Vint, the transfer transistor 101 transfers charge corresponding to the signal 103 to the amplifier input 109, thereby producing an input voltage Vin at the amplifier input 109. The amplifier 108 compares the input voltage Vin on the amplifier input 109 to the reference voltage Vref on the amplifier input 110, and provides an analog output voltage Vout on the amplifier output 107 based on this comparison. The ADC 132 of the back-end readout circuit 130 generates a multi-bit digital signal 134 based, at least in part, on the output voltage Vout.

Thus, the electronic system 100 generates a signal 103 indicating a received light intensity and converts the signal 103 to a multi-bit digital signal 134. Over time, the magnitude of the signal 103 can change to correspond to different light intensities, with a higher light intensity resulting in the multi-bit digital signal 134 having a larger digital value and a lower light intensity resulting in the multi-bit digital signal 134 having a smaller digital value. In this way, the light intensity provided by the imaging device 102 can be converted to a multi-bit digital value pertaining to a pixel within each frame of a picture, video, etc., and can be used for a variety of purposes in today's digital world.

So that the multi-bit digital signal 134 is accurate over a wide-range of light intensity values for the signal 103, the dynamic gain circuit 106 can include the variable capacitor 117 coupled on a feedback path extending from the amplifier output 107 to the amplifier input 109. The variable capacitor 117 enables the use of so-called "auto-ranging" during which a capacitance value of the variable capacitor 117 is changed to tune a gain of the dynamic gain circuit 106.

Figure 2:
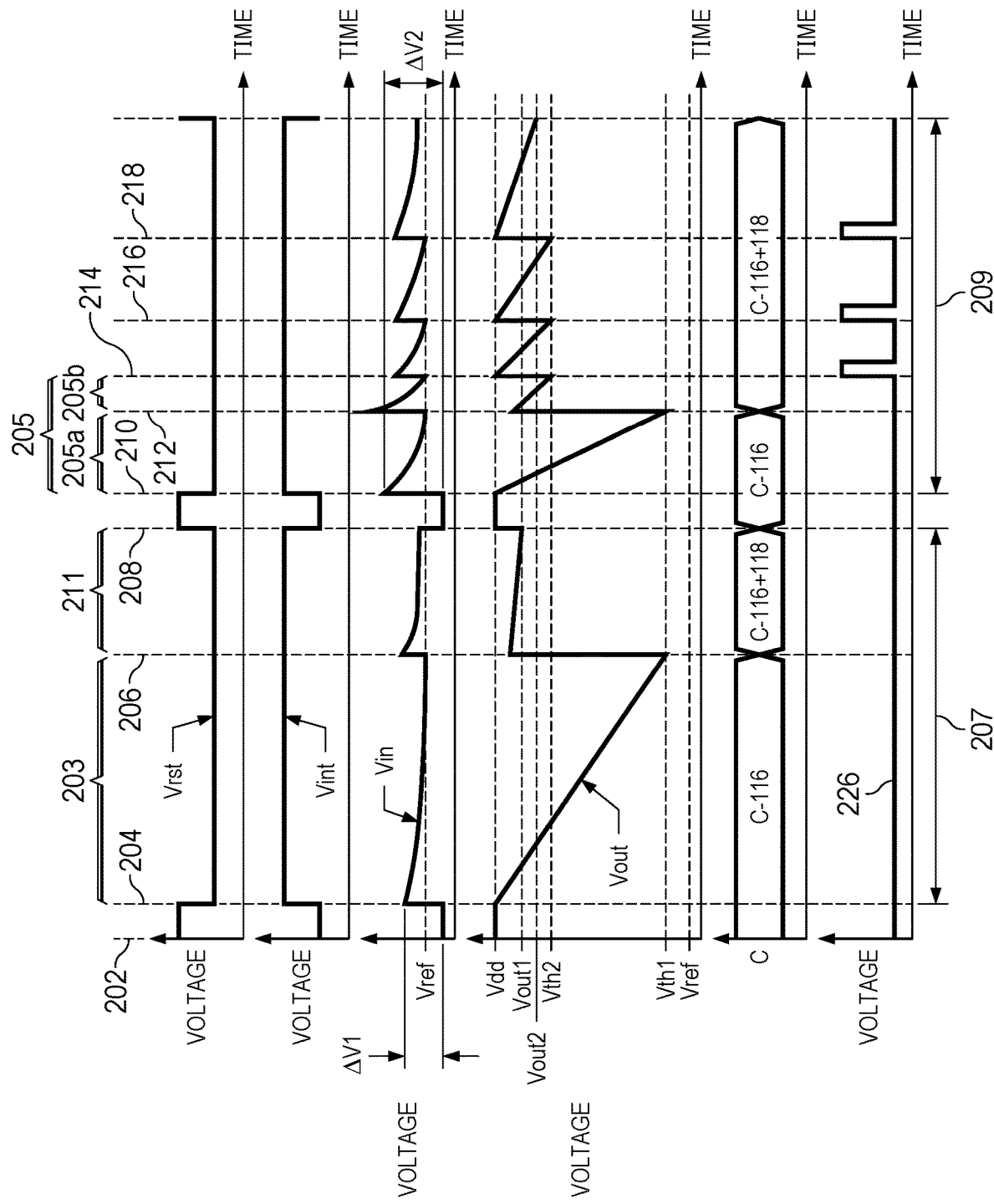
FIG. 2 illustrates a waveform diagram including examples of signals of the electronic system of FIG. 1.

Referring briefly to the left-hand portion of FIG. 2, an example of a (first) integration period 207 is illustrated that makes use of auto-ranging, during which the imaging device 102 receives a first light intensity, e.g., a low light intensity. The integration period 207 begins at 202 when a reset voltage Vrst is applied to the control terminal of the reset transistor 115. Between the time 202 and time 204, the reset voltage Vrst goes high, which pulls the input voltage Vin on the amplifier input 109 to a first voltage (e.g., ground). At time 204 the integration voltage Vint at the control terminal of the transfer transistor 101 goes high to turn on the transfer transistor 101, to transfer charge from the imaging device 102 to the amplifier input 109. In this example, this charge transfer causes the input voltage to initially increase (see $\Delta V1$), where the magnitude of $\Delta V1$ depends on the light intensity detected by the imaging device 102.

Further, during a time period 203, the switches 120a, 120b are open, such that only the feedback capacitor 116 is coupled on the feedback path. Hence, under this condition, the amplifier 108 drives charge onto the amplifier output 107 and onto the plates of the feedback capacitor 116, thereby resulting in a first voltage rate change (e.g., a first voltage slope) for Vout on the amplifier output 107 during time 203. This first voltage rate change for Vout is also capacitively coupled to the amplifier input 109, such that Vin decreases after its initial increase during 203 and tends towards Vref and/or some built-in-offset relative to Vref.

The voltage comparator 122 tracks the output voltage Vout on amplifier output 107, and at time 206 when the output voltage Vout reaches the threshold voltage Vth1, the voltage comparator 122 outputs a first control signal to couple the feedback capacitor 118 in parallel with the feedback capacitor 116. This causes the output voltage to rise quickly at time 206, as charge pre-stored on the feedback capacitor 118 is now transferred to the amplifier output 107. Then, during time 211, the output voltage continues to pull down as the amplifier 108 pulls the output voltage Vout lower based on input signal. During time 211, the output voltage changes at a second voltage rate change responsive to the feedback capacitor 118 being in parallel with the feedback capacitor 116, which is still present between the amplifier input 109 and the amplifier input 110. At time 208 the integration period 207 ends, responsive to integration voltage Vint at the control terminal of the transfer transistor 101 going low to turn off the transfer transistor 101. The value of the output voltage Vout1 at time 208 is provided to the ADC 132 to determine the multi-bit digital value.

In addition, the back-end readout circuit 130 may also account for the control signals provided to the variable capacitor 117 to determine the multi-bit digital value. In some examples, the least significant bit(s) of the multi-bit digital signal 134 is/are set based on Vout1 for the integration period 207. Further, the middle significant bit(s) of the multi-bit digital signal 134 for the integration period 207 is/are left as a "0" if the switches 120a, 120b were continuously left open during the integration period 207. In addition, the middle significant bit(s) of the multi-bit digital signal 134 for the integration period 207 is/are set to a "1" if the switches 120a, 120b were closed during the integration period 207. For example, the middle significant bit(s) is/are set to a "1" if the feedback capacitor 118 was coupled in parallel with the feedback capacitor 116 during the integration period 207. Finally, the most significant bit(s) can be left as a "0" for the integration period 207. Thus, the mechanism of auto-ranging by adding successive capacitors in parallel at various threshold voltages can serve as one way to provide an imaging device with a large operating range.

Additional capacitors may be added in parallel with the feedback capacitor 116 and feedback capacitor 118 to give a larger operating range for the imaging device. However, additional capacitors creates a larger footprint on the chip and may require a larger supply, thereby increasing cost and/or power dissipation. This issue is exacerbated in multi-channel image sensor devices as each channel may include feedback capacitors. For example, the electronic system 100 includes a 256-channel image sensor device having at least the feedback capacitors 116, 118 for each channel. As such, the feedback capacitors may consume a significant area on the chip and can decrease the number of devices disposed over a single substrate, thereby increasing manufacturing costs and/or decreasing device density.

Therefore, turning back to FIG. 1, some examples implement the charge dump circuit 112 coupled to the amplifier input 109. The charge dump circuit 112 provides an input charge at the amplifier input 109 in response to the voltage comparator 122 detecting the output voltage Vout dropping below the threshold voltage Vth2. The input charge reduces the charge level at the amplifier input 109, thereby "tuning" the drive strength of the amplifier and changing the charge/discharge rate of the output voltage Vout. As a result, this approach can provide a larger operating range while employing fewer and/or smaller capacitors than other auto-ranging approaches. Thus, manufacturing costs may be decreased and device density increased.

Referring to the right-hand portion of FIG. 2, an example (second) integration period 209 is illustrated during which of the imaging device 102 receives a second light intensity. The second light intensity during the integration period 209 is greater than the first light intensity during the integration period 207. As such, the imaging device 102 can use both the previously described auto-ranging with capacitors and charge dumping techniques to realize a large range in a small footprint.

The integration period 209 begins at 210 when the reset voltage Vrst goes high and pulls the amplifier input 109 to the first voltage (e.g., ground). At time 210 the voltage Vint goes high to again turn on the transfer transistor 101 and transfer charge from the imaging device 102 to the input 109 of the amplifier 108. Note that the light intensity of the signal 103 during the integration period 209 is greater than the integration period 207 (see ΔV2) causing charge dump circuit 112 to be activated in this example. During the time period 205a, the switches 120a, 120b are open, such that only the feedback capacitor 116 is included on the feedback path. Further, during time 205a, the amplifier 108 again drives charge onto the amplifier output 107 and onto the plates of the feedback capacitor 116. This results in a second voltage rate change on the amplifier output 107 during time 205a responsive to Vout exceeding Vth1. Because of the larger voltage difference in the integration period 209 compared to the integration period 207 (see ΔV2 compared to ΔV1), the feedback capacitor 116 (dis)charges more quickly than during time 203. When the threshold voltage Vth1 is reached at time 212, the voltage comparator 122 again enables the switches 120a, 120b and couples the feedback capacitor 118 in parallel with the feedback capacitor 116. During time 205b, (dis)charging continues with the feedback capacitors 116, 118 in parallel.

In the integration period 209, the light intensity is sufficiently large that at time 214, the output voltage Vout drops to or below the threshold voltage Vth2. The voltage comparator 122 detects this change and triggers a charge dump signal 226 to go high. Responsive thereto, the charge dump circuit 112 transfers or "dumps" a predetermined amount of charge from or to the amplifier input 109, to change Vin. The predetermined amount of charge is based on a capacitance of a charge dump capacitor in the charge dump circuit 112 (e.g., see FIG. 3). For example, the capacitance of the charge dump capacitor is selected to minimize a lateral footprint of the dynamic gain circuit 106 while being sufficiently large to adequately change Vin at each transfer or "dump." Thus, between time 214 and 216, the charge dump circuit transfers charge from the amplifier input 109, causing the output voltage Vout to rise. This slows down the (dis)charge rate of the voltage output Vout, which increases the operating range of the electronic system 100. This process is repeated at times 216 and 218. At each time 216 and 218, the output voltage Vout drops to or below the threshold voltage Vth2. These drops are detected by the voltage comparator 122 thereby causing the charge dump signal 226 to go high and triggering the charge dump circuit 112 to provide the input charge at the amplifier input 109.

Accordingly, the dynamic gain circuit 106 may process both low intensity and high intensity signals (different intensity signals) within predefined noise constraints and with high resolution while reducing the size of the feedback capacitor(s) of the dynamic gain circuit 106. This occurs by detecting the drop of the output voltage Vout below the threshold voltage Vth2, after the initial voltage drop during the time frame 205, and by providing the input charge to the amplifier input 109 in response to the detected voltage drop. As a result, a lateral footprint of the dynamic gain circuit 106 is reduced with an increase in a noise performance of the dynamic gain circuit 106. Thus, device density and an overall performance of the dynamic gain circuit 106 is increased.

In addition, the control signals provided to the variable capacitor 117 at time 212, as well as the charge dump signals provided at times 214, 216, and/or 218 are also provided to the back-end readout circuit 130. The back-end readout circuit 130 generates the multi-bit digital signal (e.g., a word) corresponding to an intensity of light during the integration period 209. The back-end readout circuit 130 may generate the multi-bit digital signal 134 to account for the control signals provided to the variable capacitor 117 and/or to the charge dump circuit 112. In some examples, for the integration period 209, the least significant bit(s) of the multi-bit digital signal 134 is/are set based on the voltage level Vout2. Further, the middle significant bit(s) of the multi-bit digital signal 134 for the integration period 209 is/are set to a "1" as the switches 120a, 120b were closed during the integration period 207. For example, if the feedback capacitor 118 was coupled in parallel with the feedback capacitor 116. Furthermore, the most significant bit(s) is/are set to a "1" to indicate the fact that the charge dump circuit was utilized.

Thus, compared to approaches where multiple capacitors are used with each capacitor being successively coupled in parallel with other capacitors, the charge dump circuit 112 of FIG. 1 provides a technique whereby a single circuit element can be re-used to repeatedly change the amount of charge on the input of the amplifier. Accordingly, the charge dump circuit 112 can consume less area than the parallel capacitor approach, while providing comparable auto-ranging. In other examples, the charge dump circuit 112 can be used in and of itself without the variable capacitor 117.

Figure 3:
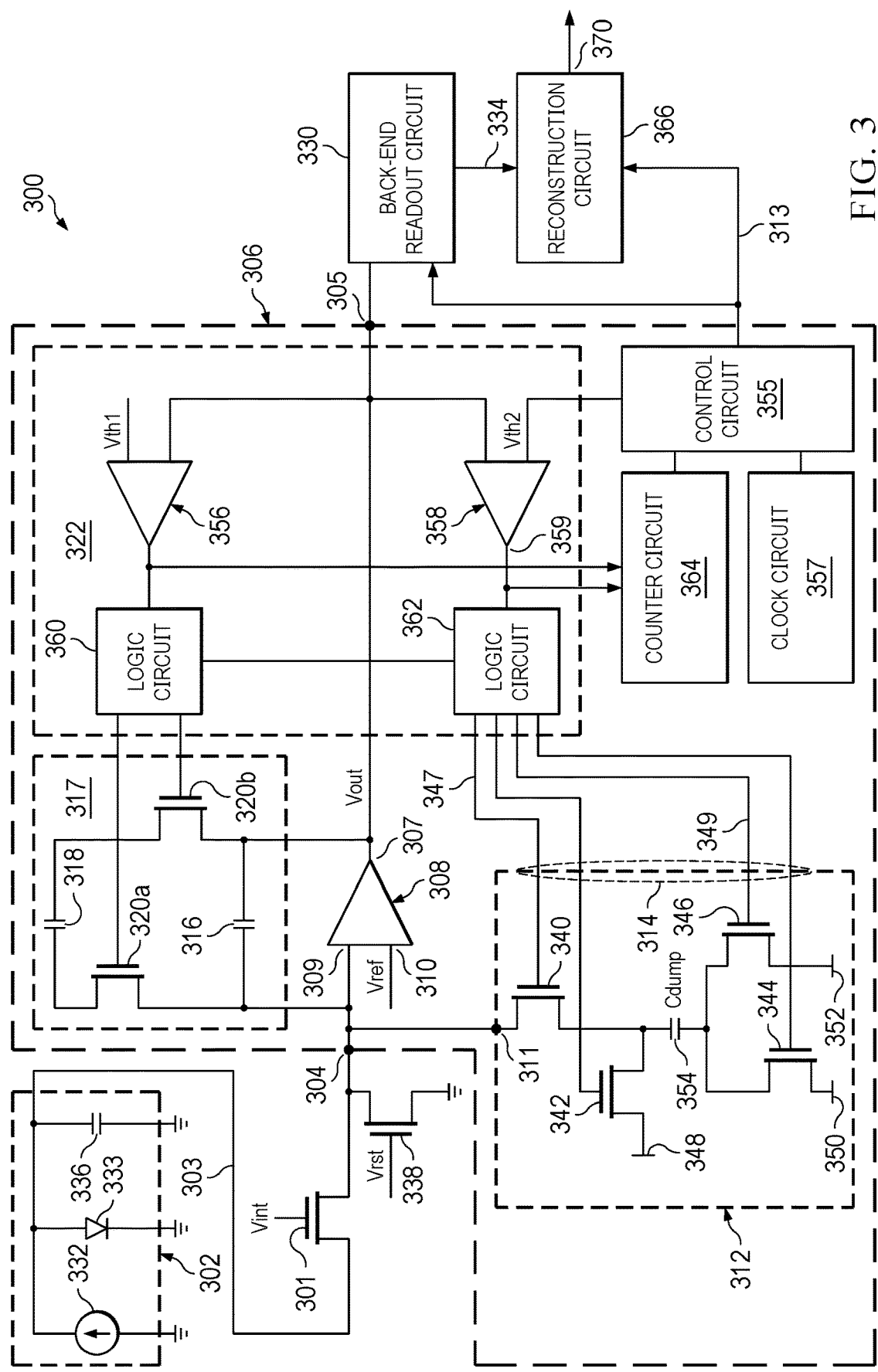
FIG. 3 illustrates a block diagram of an example electronic system including a dynamic gain circuit.

FIG. 3 provides a more detailed example of an electronic system 300 including a charge dump circuit 312 coupled to a first amplifier input 309 of an amplifier 308. As shown, the electronic system 300 further includes an imaging device 302, a transfer transistor 301, a reset transistor 338, a dynamic gain circuit 306, a back-end readout circuit 330, and a reconstruction circuit 366. Accordingly, the features explained above with regards to FIG. 1 can be consistent with some examples of the electronic system 300 in FIG. 3 (and vice versa). For example, imaging device 302 can be an example of imaging device 102, dynamic gain circuit 306 can be an example of dynamic gain circuit 106, charge dump circuit 312 can be an example of charge dump circuit 112, voltage comparator 322 can be an example of voltage comparator 122, etc. As shown, similar components, terminals, inputs, and outputs in FIGS. 1 and 3 are similarly labeled and similarly coupled.

The imaging device 302 includes a current source 332 coupled between ground and a first terminal of a transfer transistor 301, a diode 333 coupled between ground and the first terminal of the transfer transistor 301, and a pixel capacitor 336 coupled between ground and the first terminal of the transfer transistor 301. The imaging device 302 may be configured as a photodiode that converts incident electromagnetic radiation (e.g., light) to a signal 303 (e.g., a photocurrent).

The first terminal of the transfer transistor 301 is coupled to an output of the imaging device 302, and a second terminal of the transfer transistor 301 is coupled to an input 304 of the dynamic gain circuit 306. A control terminal of the transfer transistor 301 is coupled to an imaging control circuit (not shown) that provides an integration signal, for example an integration voltage Vint. The reset transistor 338 has a first terminal coupled to an input 304 of the dynamic gain circuit 306 and a second terminal coupled to ground. A control terminal of the reset transistor 338 is coupled to the imaging control circuit (not shown) that provides a reset signal, for example the reset voltage Vrst. By applying suitable biasing conditions to the control terminal of the transfer transistor 301, the signal 303 is provided to the input 304 of the dynamic gain circuit 306.

The dynamic gain circuit 306 includes the amplifier 308, a variable capacitor 317, a voltage comparator 322, the charge dump circuit 312, a counter circuit 364, a control circuit 355, and a clock circuit 357. The amplifier 308 has the input 309 (e.g., an inverting node), a second amplifier input 310 (e.g., a non-inverting node), and an amplifier output 307. The amplifier input 309 corresponds to the input 304 of the dynamic gain circuit 306 and the amplifier output 307 corresponds to an output 305 of the dynamic gain circuit 306.

The variable capacitor 317 is coupled between the input 309 of the amplifier 308 and the output 307 of the amplifier 308. The variable capacitor 317 has a (first) feedback capacitor 316, a (second) feedback capacitor 318, a (first) switching device (or switch) 320a, a (second) switching device (or switch) 320b. As shown, the switching devices 320a, 320b are transistors, in this example as FETs. The switching device 320a and the switching device 320b are arranged to selectively couple the feedback capacitor 318 in parallel with the feedback capacitor 316 responsive to a control signal from the voltage comparator 322. The feedback capacitor 316 has a first terminal coupled to the amplifier input 309 and a second terminal coupled to the amplifier output 307. The switching device 320a has a first terminal coupled to the amplifier input 309, a second terminal coupled to a first terminal of the feedback capacitor 318, and a control terminal coupled to the voltage comparator 322. The switching device 320b has a first terminal coupled to the amplifier output 307, a second terminal coupled to a second terminal of the feedback capacitor 318, and a control germinal coupled to the voltage comparator 322.

The amplifier 308 generates an output voltage Vout at the amplifier output 307 based on the signal 303, an output of the charge dump circuit 312, and capacitance(s) of the feedback capacitor 316 and/or the feedback capacitor 318. A gain value of the amplifier 308 is based on the capacitance(s) of the feedback capacitor 116 and/or the feedback capacitor 318. In some examples, a first capacitance (e.g., about 1 pF) of the feedback capacitor 316 is less than a second capacitance (e.g., about 10 pF) of the feedback capacitor 318.

The voltage comparator 322 is coupled between the amplifier output 307 and the switching devices 320a-b. The voltage comparator 322 includes a (first) comparator circuit 356, a (second) comparator circuit 358, a (first) logic circuit 360, and a (second) logic circuit 362. The voltage comparator 322 has first outputs coupled to the control terminals of the switching devices 320a, 320b, second outputs coupled to a charge dump input 314 of the charge dump circuit 312, and third outputs coupled to inputs of the counter circuit 364. Further, the voltage comparator 322 has a first input coupled to the amplifier output 307, a second input coupled to a voltage supply (not shown) that provides the threshold voltage Vth1, and a third input coupled to an output of the control circuit 355 that includes a voltage supply (not shown) that provides the threshold voltage Vth2.

The comparator circuit 356 has a first input coupled to the amplifier output 307 and a second input coupled the voltage supply (not shown) that provides the threshold voltage Vth1. In some examples, the comparator circuit 356 is an amplifier. In such examples, the first input of the comparator circuit 356 is a non-inverting input and the second input of the comparator circuit 356 is an inverting input. An output of the comparator circuit 356 is coupled to an input of the logic circuit 360 and an input of a counter circuit 364. An output of the logic circuit 360 is coupled to control terminals of the switching devices 320a, 320b. In some examples, the logic circuit 360 includes one or more logic FET(s) or logic BJT(s), one or more flip-flop(s), one or more multiplexer(s), one or more arithmetic logic unit(s), other suitable logic device(s), or any combination of the foregoing.

The comparator circuit 358 has a first input coupled to the amplifier output 307 and a second input coupled to the output of the control circuit 355 that includes the voltage supply (not shown) that provides the threshold voltage Vth2. In some examples, the comparator circuit 358 is an amplifier, in which the first input of the comparator circuit 358 is a non-inverting input, and the second input of the comparator circuit 358 is an inverting input. An output of the comparator circuit 358 is coupled to an input of the logic circuit 362 and the input of the counter circuit 364. An output of the logic circuit 362 is coupled to control terminals of the transistors 340-346 of the charge dump circuit 312. In some examples, the logic circuit 362 includes one or more FET(s) or BJT(s), one or more flip-flop(s), one or more multiplexer(s), one or more arithmetic logic unit(s), other suitable logic device(s), or any combination of the foregoing.

The comparator circuit 356 performs a first comparison between the output voltage Vout and the threshold voltage Vth1 and generates a first comparator signal based on the first comparison. For example, if the comparator circuit 356 detects that the output voltage Vout is less the threshold voltage Vth1 then the comparator circuit 356 generates a first comparator signal that switches the switching devices 320*a-b* on. As a result, the gain value of the amplifier 308 is determined by both the first capacitance of the feedback capacitor 316 and the second capacitance of the feedback capacitor 318, and is relatively low. For example, during an integration period the comparator circuit 356 detects whether the output voltage Vout has dropped below the threshold voltage Vth1 and generates or updates the first comparator signal. The first comparator signal indicates the drop below the threshold voltage Vth1. The first comparator signal is provided to the logic circuit 360 which suitably biases the switching devices 320*a-b* to remain on during a remaining duration of the integration period.

The comparator circuit 358 performs a second comparison between the output voltage Vout and the threshold voltage Vth2 and generates a second comparator signal based on the second comparison. For example, if the comparator circuit 358 detects that the output voltage Vout is less than the threshold voltage Vth2 then the comparator circuit 358 generates a second comparator signal. Further, the first comparator signal generated by the comparator circuit 356 is provided to the logic circuit 362, which suitably biases the transistors 340-346 of the charge dump circuit 312. In some examples, the second comparison is performed after the first comparison is performed by the comparator circuit 356 such that the feedback capacitor 318 is directly electrically coupled between the amplifier input 309 and the amplifier output 307 before performing the second comparison.

The charge dump circuit 312 provides an input charge at the amplifier input 309 based on the second comparator signal from the voltage comparator 322. The charge dump circuit 312 has an input 314 coupled to the output of the logic circuit 362 and an output 311 coupled to the amplifier input 309. The charge dump circuit 312 can be implemented in several different ways. For example, the charge dump circuit 312 includes a plurality of transistors 340-346 and the charge dump capacitor 354. In some examples, the transistors 340-346 are field-effect transistors (FETs), bipolar junction transistors (BJTs), junction field effect transistors (JFETs), or the like.

The plurality of transistors 340-346 includes a (first) transistor 340, a (second) transistor 342, a (third) transistor 344, and a (fourth) transistor 346. The transistor 340 has a first terminal coupled to the amplifier input 309, a second terminal coupled to a first terminal of the charge dump capacitor 354, and a control terminal coupled to the output of the logic circuit 362. The transistor 342 has a first terminal coupled to the first terminal of the charge dump capacitor 354, a second terminal coupled to a (first) voltage supply terminal 348, and a control terminal coupled to the output of the logic circuit 362. The transistor 344 has a first terminal coupled to a second terminal of the charge dump capacitor 354, a second terminal coupled to a second voltage supply terminal 350, and a control terminal coupled to the output of the logic circuit 362. The transistor 346 has a first terminal coupled to the second terminal of the charge dump capacitor 354, a second terminal coupled to a third voltage supply terminal 352, and a control terminal coupled to the output of the logic circuit 362.

In some examples, the voltage supply terminal 348 is a terminal of the electronic system 300 that receives a first supply voltage (e.g., ground) from a voltage supply circuit (not shown). The voltage supply terminal 350 is a terminal of the electronic system 300 that receives a second supply voltage (e.g., about 1 volt) from a voltage supply circuit (not shown). The voltage supply terminal 352 is a terminal of the electronic system 300 that receives the first supply voltage (e.g., ground) from a voltage supply circuit (not shown).

Responsive to the output voltage Vout being less than the threshold voltage Vth2, the comparator circuit 358 provides the second comparator signal to the logic circuit 362. The logic circuit 362 provides the second comparator signal to control terminals of the transistors 340-346. Accordingly, the transistor 340 and the transistor 346 are biased to be on, and the transistor 342 and the transistor 344 are biased to be off. As a result, input charge from the charge dump capacitor 354 is provided at the amplifier input 309. This input charge reduces the charge accumulated at the amplifier input 309 by the signal 303, such that the output voltage Vout is increased above the threshold voltage Vth2 by a predefined amount. The predefined amount of increase of the output voltage Vout is based on a capacitance Cdump of the charge dump capacitor 354. Thus, the dynamic gain circuit 306 may process relatively large signals 303 (e.g., less than about 100 pC) within predefined noise constraints while facilitating the second capacitance of the feedback capacitor 318 being relatively small. Accordingly, noise, power, and area of the dynamic gain circuit 306 may be decreased.

The clock circuit 357 is coupled to components of the dynamic gain circuit 306 and may synchronize decisions of the components. For example, an output of the clock circuit 357 is coupled to a first input of the control circuit 355. An output of the counter circuit 364 is coupled to a second input of the control circuit 355. An output of the control circuit 355 is coupled to inputs of the back-end readout circuit 330 and the reconstruction circuit 366. Further, an output of the back-end readout circuit 330 is coupled to a second input of the reconstruction circuit 366.

The clock circuit 357 may synchronize the generated first and second comparator signals provided by the voltage comparator 322 such that signals (e.g., voltage) applied to control terminals of the switching devices 320*a*, 320*b* and to control terminals of the transistors 340-346 are done on a rising edge or a falling edge of a clock signal provided by the clock circuit 357. Further, the counter circuit 364 is coupled to the comparator circuits 356, 358 and generates a counter signal based on the first comparison and the second comparison. The generated counter signal provides details about: a number of times the output voltage Vout was at or below the threshold voltage Vth2; when the charge dump circuit 312 performs each charge dump; and when the output voltage Vout was at or below the threshold voltage Vth1. The clock signal and the counter signal are provided to the control circuit 355. The control circuit 355 adjusts the threshold voltage Vth2 based on the counter signal. In some examples, the control circuit 355 includes a resistor ladder that adjusts the threshold voltage Vth2.

Further, the control circuit 355 outputs a control signal 313 to the back-end readout circuit 330 and/or the reconstruction circuit 336. In some examples, the control signal 313 includes the clock signal, the counter signal, and/or adjustments to the threshold voltage Vth2. The back-end readout circuit 330 generates a digital signal 334 (e.g., bytes) that correspond to an intensity of the signal 303 during each integration period of the imaging device 302 based on the output voltage Vout and the control signal 313. The reconstruction circuit 366 reconstructs a final output 370 (e.g., an image) based on the digital signal 334 generated from the back-end readout circuit 130, the gain of the amplifier 108, the counter signal, the clock signal, and/or calibration coefficients.

Figure 4:
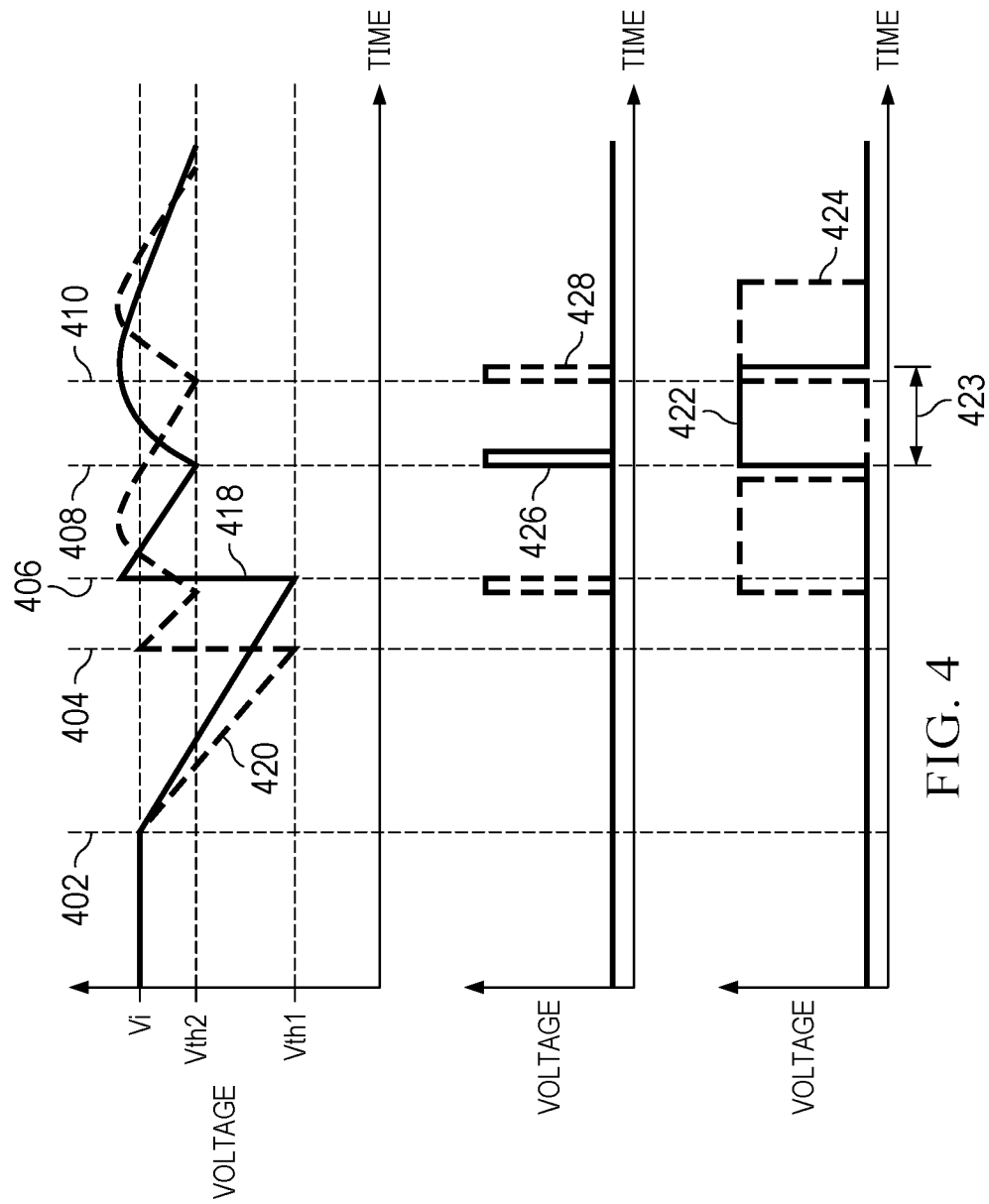
FIGS. 4-6 illustrate waveform diagrams including examples of signals of the electronic system of FIG. 3.

FIG. 4 provides an example of output voltages that can be provided by various dynamic gain circuits. For example, a (first) output voltage 418 may correspond to the output voltage of a first dynamic gain circuit and a (second) output voltage 420 may correspond to the output voltage of a second dynamic gain circuit. In this example, the first dynamic gain circuit is part of a first channel of a multi-channel image sensor device, and the second dynamic gain circuit is part of a separate second channel of the multi-channel image sensor device. The first dynamic gain circuit and the second dynamic gain circuit may each be configured as the dynamic gain circuit 106 of FIG. 1 or the dynamic gain circuit 306 of FIG. 3. Moreover, each may include a charge dump circuit, e.g., the charge dump circuit 112 of FIG. 1 or the charge dump circuit of FIG. 3. Further, a (first) control signal 422 corresponds to voltage applied to control terminals of first and fourth transistors of the charge dump circuit of the first dynamic gain circuit, and a (second) control signal 424 corresponds to voltage applied to control terminals of first and fourth transistors of the charge dump circuit of the second dynamic gain circuit. A (first) comparator output signal 426 corresponds to an output of a second comparator circuit of the first dynamic gain circuit. A (second) comparator output signal 428 corresponds to an output of a second comparator circuit of the second dynamic gain circuit.

At time 402, the integration period for both of the first and second dynamic gain circuits begins. At time 404, the output voltage 420 of the second dynamic gain circuit drops to or below the threshold voltage Vth1, which triggers changing the gain of the second dynamic gain circuit by adjusting the capacitance across a feedback path of the corresponding amplifier. At time 406, the output voltage 418 of the first dynamic gain circuit drops to or below the threshold voltage Vth1, which triggers changing the gain of the first dynamic gain circuit. At time 408, the output voltage 418 of the first dynamic gain circuit drops to or below the threshold voltage Vth2. As a result, the charge dump circuit of the first dynamic gain circuit initiates a first charge dump, in which both the first control signal 422 and the first comparator output signal 426 go high. In some examples, a duration of the first charge dump corresponds to the time frame 423, in which the first control signal 422 remains high.

At time 410, the output voltage 420 of the second dynamic gain circuit drops to or below the threshold voltage Vth2. This results in the charge dump circuit of the second dynamic gain circuit initiating a second charge dump, in which both the second control signal 424 and the second comparator output signal 428 go high. In some examples, as illustrated in FIG. 4, the first and second dynamic gain circuits operate asynchronously, such that each may perform a charge dump out of sync of one another or out of sync of a clock signal.

Further, in such examples, the time in which charge dumps occur is based on a level of the corresponding signal (e.g., signal 103 and/or 303) input into the first and second dynamic gain circuits. As a result, the second dynamic gain circuit may initiate the second charge dump at time 410 during the time frame 423 where the first dynamic gain circuit is still completing the first charge dump. This may disturb a reference voltage at an input of the first dynamic gain circuit and adversely affect the input charge to be subtracted at the input, thereby causing crosstalk (e.g., as a result of non-linearity) between channels of the multi-channel image sensor device. This occurs because the first and second dynamic gain circuits are different channels of the multi-channel image sensor device and therefore share power supplies, voltage rails, and other peripheral/support circuitry. The disturbance of the reference voltage at the input of the first dynamic gain circuit may occur due to power supply ripple rejection (PSRR) from the first and second dynamic gain circuits sharing power supplies and voltage rails between amplifiers of the first and second dynamic gain circuits. Consequently, amplifiers of the first and second dynamic gain circuits may suffer from integral non-linearity and results in the output voltages 418, 420 having slow settling errors.

Figure 5:
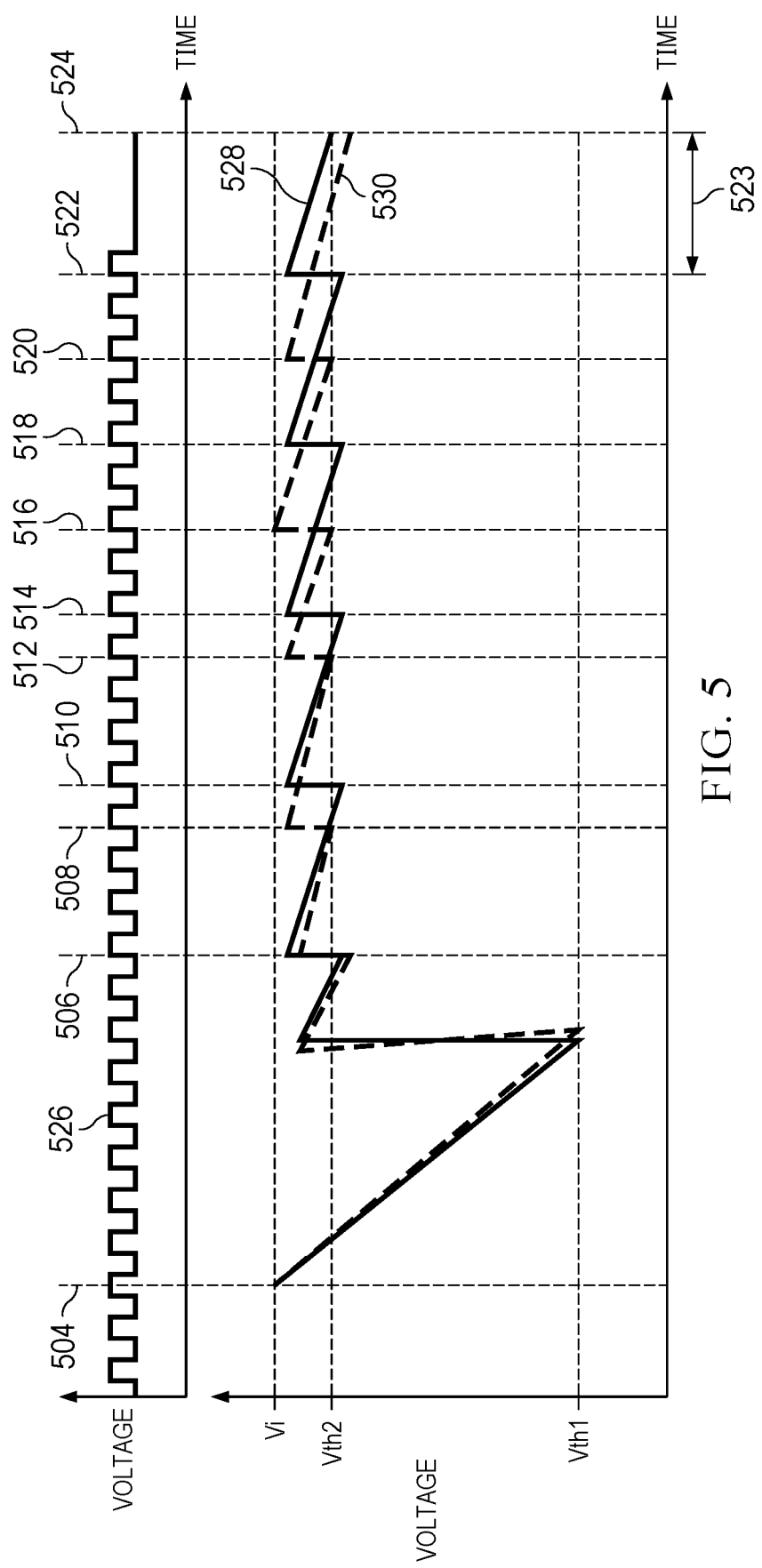

FIG. 5 provides an example of output voltages that can be provided by various dynamic gain circuits, in which charge dumps occur based at least in part on a corresponding signal level and a clock signal across channels of a multi-channel image sensor device. For example, a first output voltage 528 may correspond to the output voltage of a first dynamic gain circuit, and a second output voltage 530 may correspond to the output voltage of a second dynamic gain circuit. wherein this example, the first dynamic gain circuit is part of a first channel of a multi-channel image sensor device, and the second dynamic gain circuit is part of a separate second channel of the multi-channel image sensor device. In such examples, the first dynamic gain circuit and the second dynamic gain circuit may each be configured as the dynamic gain circuit 106 of FIG. 1 or the dynamic gain circuit 306 of FIG. 3. For example, the first and second dynamic gain circuits each include a charge dump circuit, such as the charge dump circuit 112 or the charge dump circuit 312, and a clock circuit such as the clock circuit 357. The clock circuit may be global and/or accessed by all channels of the multi-channel image sensor device. Further, the clock circuit 357 provides the clock signal 526 that synchronizes actions of the first and second dynamic gain circuits, thereby reducing issues related to crosstalk and/or PSRR.

At time 504, the integration period for both of the first and second dynamic gain circuits begins. Before time 506 both the output voltages 528, 530 drop to or below the threshold voltage Vth2. However, charge dump circuits of the first and second dynamic gain circuits wait to initiate charge dumps at the next rising edge of the clock signal 526. At time 506 the charge dump circuits of the first and second dynamic gain circuits each perform a charge dump. In some examples, the charge dump circuits initiate charge dumps based at least in part on a level of a corresponding signal and the clock signal 526, such that a charge dump on a first channel is not initiated while a different charge dump is being completed on a second channel. As a result, issues related to PSRR are mitigated and linearity of the output voltages 528, 530 is increased.

At time 508 a second charge dump is initiated in the second dynamic gain circuit and the output voltage 528 goes below the threshold voltage Vth2 shortly after time 508. However, a third charge dump for the first dynamic gain circuit is not started until the next rising edge of the clock signal 526, which occurs at time 510. In some examples, a frequency of the clock signal 526 is sufficiently high so that the third charge dump starts after the second charge dump has ended. This further improves linearity of the output voltages 528, 530 and mitigates the initiation of a charge dump in one channel from occurring while a charge dump is still being completed on another channel. This process may continue from time 512 to 522, where the charge dump circuits of the first and second dynamic gain circuits perform charge dumps based at least in part on the clock signal 526.

In some examples, the frequency of the clock signal 526 is at least 20 percent greater than a frequency used to properly measure the signal, thereby mitigating missed charge dumps. For example, if the frequency used to properly measure the signal is 2.5 microseconds, then the frequency of the clock signal 526 is at least 2 microseconds.

Further, between time 522 and time 524 there is a charge dump disable period 523 near an end of the integration period. During the charge dump disable period 523, no more charge dumps are performed even as the output voltages 528, 530 may go below the threshold voltage Vth2. A last clock cycle in the clock signal 526 indicates the charge dump disable period 523. Further, prior clock positions are back calculated from the last clock cycle in the clock signal 526 and the prior clock positions. The charge dump disable period 523 provides additional time for settling of the output voltage Vout, filtering, and determining view jitter in the signal at the end of the integration period, while mitigating any adverse effects a charge dump may cause to the aforementioned processes. This decreases cross-talk and non-linearity across channels in the multi-channel image sensor device. In some examples, a duration of the charge dump disable period 523 is based on a maximum amplitude of the signal and the second capacitance of the feedback capacitor 318.

Figure 6:
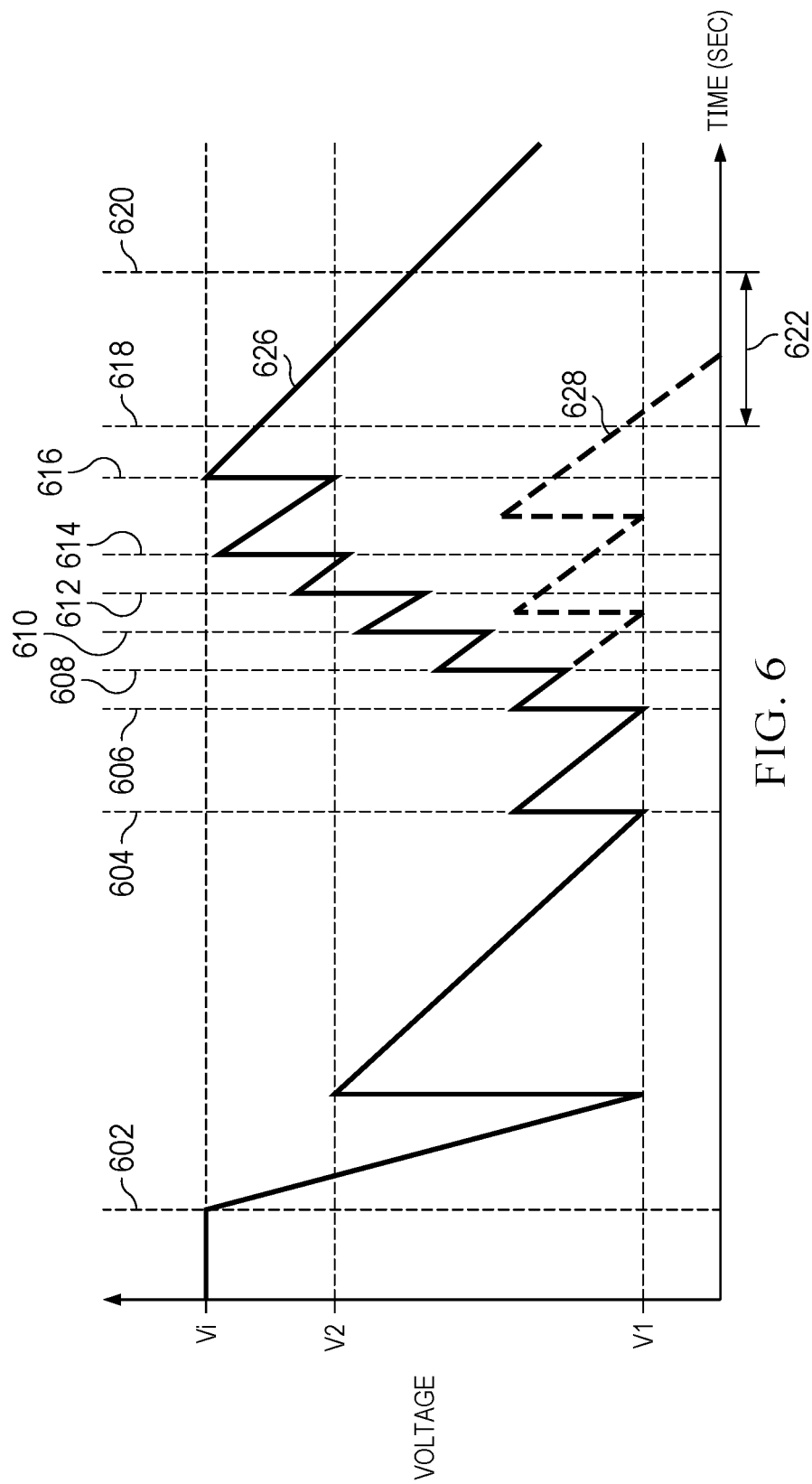

FIG. 6 provides an example of output voltages that can be provided by various dynamic gain circuits. For example, a first output voltage 626 may correspond to the output voltage of a first dynamic gain circuit, and a second output voltage 628 may correspond to the output voltage of a second dynamic gain circuit. In some examples, the first dynamic gain circuit includes a control circuit 355 that adjusts the threshold voltage Vth2 based at least in part on the first output voltage 626 and a counter signal. However, the second dynamic gain circuit does not adjust the threshold voltage Vth2.

At time 602, the integration period for both the first and second dynamic gain circuits begins. At time 604, a first charge dump is performed when the second output voltage 628 is at or below a first voltage V1, e.g., about 0.5 volts or about 0.25 volts. Further, a second charge dump is performed at time 606. Additional charge dumps are performed by the second dynamic gain circuit each time the second output voltage 628 is at or below the first voltage V1. In such examples, the threshold voltages Vth1 and Vth2 of the second dynamic gain circuit are relatively small and/or equal. Having the threshold voltage Vth2 relatively small, e.g., about 0.5 volts or about 0.25 volts, decreases issues related to non-linearity in the second dynamic gain circuit as a result of settling error. The non-linearity issues are exacerbated for signals that are relatively small. Thus, the relatively small threshold voltage Vth2 increases a performance of the second dynamic gain circuit.

However, the second dynamic gain circuit does not adjust the threshold voltage Vth2 before a charge dump disable period 622 that begins at time 618. As a result, the second output voltage 628 may reach saturation before an end of the charge dump disable period 622 and/or before an end of the integration period. This may reduce an ability to perform filtering and/or determine view jitter at the end of the integration period and may be due to limitations in the output voltage range of the amplifier 308 and/or a duration of the charge dump disable period 622.

To limit adverse performance due to limitations in the output voltage range of the amplifier 308, the first dynamic gain circuit adjusts the threshold voltage Vth2 before the charge dump disable period 622. For example, at times 604 and 606, the first dynamic gain circuit performs a first charge dump and a second charge dump while the threshold voltage Vth2 is relatively small (e.g., about 0.5 volts or about 0.25 volts). This decreases issues related to non-linearity in the first dynamic gain circuit.

Further, in an effort to increase headroom before the charge dump disable period 622 begins, the control circuit 355 of the first dynamic gain circuit adjusts the threshold voltage Vth2 based at least in part on a number of charge dumps performed (e.g., based on the counter signal) and on the first output voltage 626. For example, the threshold voltage Vth2 is changed from about volts to about 1.25 volts. At times 608-614 a charge dump may be performed, (e.g., at each clock cycle) until the first output voltage 626 is at or above a second voltage V2 (e.g., about 1.25 volts) that is greater than the first voltage V1. Accordingly, the first output voltage 626 is substantially large before the charge dump disable period 622 begins at 618. Accordingly, the first output voltage 626 does not reach saturation before the end of the charge dump disable period 622 and/or before the end of the integration period. Therefore, adjusting the threshold voltage Vth2 may decrease issues related to non-linearity while mitigating issues related to the output voltage range of the amplifier 308.

Figure 7:
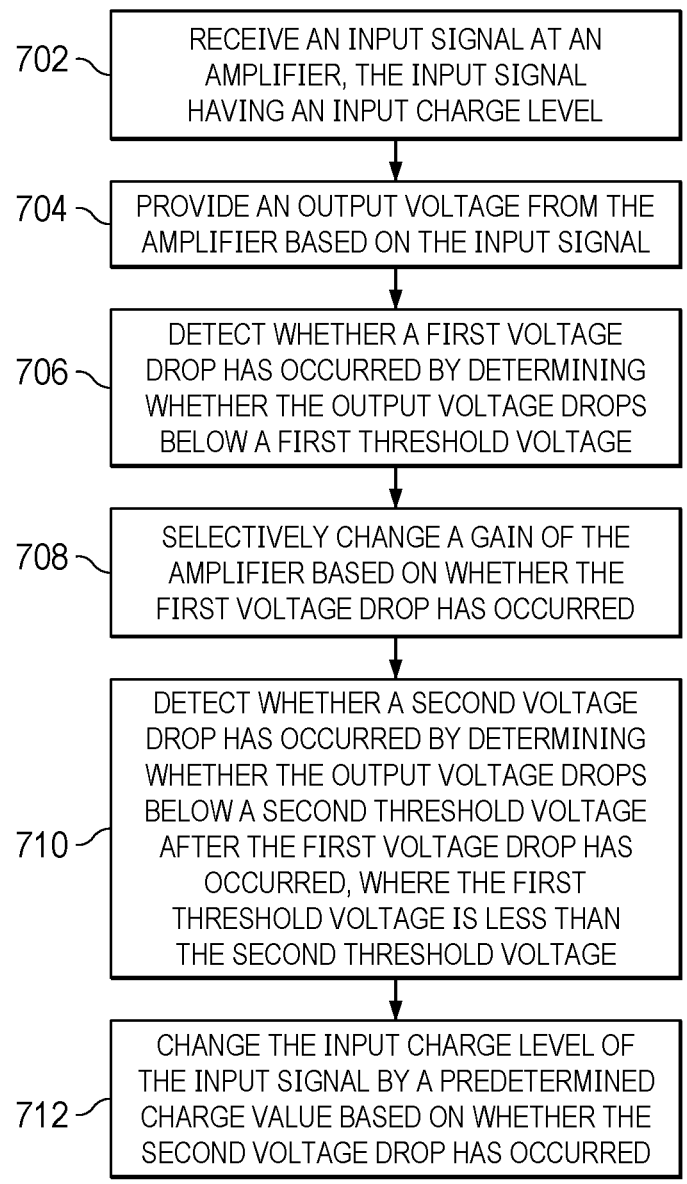
FIG. 7 illustrates a flow diagram of an example method of the present description.

FIG. 7 is a flow diagram depicting an example method. For example, the method is performed by one or more elements of the electronic system 100 of FIG. 1 or the electronic system 300 of FIG. 3, as described herein. At act 702, an input signal is received at an amplifier. The input signal has an input charge level. At act 704, an output voltage is provided from the amplifier based on the input signal. At act 706, the method detects whether a first voltage drop has occurred by determining whether the output voltage is at or drops below a first threshold voltage. At act 708, a gain of the amplifier is selectively changed based on whether the first voltage drop has occurred. At act 710, the method detects whether a second voltage drop has occurred by determining whether the output voltage is at or drops below a second threshold voltage after the first voltage drop has occurred. The first threshold voltage is less than the second threshold voltage. At act 712, the input charge level of the input signal is changed by a predetermined charge value based on whether the second voltage drop has occurred.

The methods are illustrated and described above as a series of acts or events, but the illustrated ordering of such acts or events is not limiting. For example, some acts or events occur in different orders and/or concurrently with other acts or events apart from those illustrated and/or described herein. Also, some illustrated acts or events are optional to implement one or more aspects or examples of this description. Further, one or more of the acts or events depicted herein may be performed in one or more separate acts and/or phases. In some examples, the methods described above may be implemented at least partially in a computer readable medium using instructions stored in a memory.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means within +/−10 percent of the stated value, or, if the value is zero, a reasonable range of values around zero. Modifications are possible in the described examples, and other implementations are possible, within the scope of the claims.

What is claimed is:

1. A circuit comprising:
an amplifier having an input and an output;
a voltage comparator having an input and first and second outputs, the input of the voltage comparator coupled to the output of the amplifier;
a variable capacitor circuit coupled between the input and the output of the amplifier, and coupled to the first output of the voltage comparator; and
a charge dump circuit having an input and an output, the input of the charge dump circuit coupled to the second output of the voltage comparator, the output of the charge dump circuit coupled to the input of the amplifier.

2. The circuit of claim 1, wherein the charge dump circuit is configured to change an input charge at the input of the voltage comparator by a first charge value based on an output voltage at the output of the amplifier and based on a threshold voltage.

3. The circuit of claim 1, wherein the variable capacitor circuit includes:
a first capacitor coupled between the input and the output of the amplifier;
a second capacitor having first and second terminals;
a first switching device coupled between the first terminal of the second capacitor and the output of the amplifier, and having a control terminal coupled to the first output of the voltage comparator; and
a second switching device coupled between the second terminal of the second capacitor and the input of the amplifier, and having a control terminal coupled to the first output of the voltage comparator.

4. The circuit of claim 3, wherein the voltage comparator is configured to provide a control signal to the control terminal of the first switching device and to the control terminal of the second switching device based on an output voltage at the output of the amplifier and based on a threshold voltage.

5. The circuit of claim 4, wherein the first and second switching devices are configured to directly connect the second capacitor between the input and the output of the amplifier responsive to the control signal responsive to the output voltage being at or below the threshold voltage.

6. The circuit of claim 1, wherein the charge dump circuit comprises:
a capacitor having first and second terminals; and
a first transistor coupled between the first terminal of the capacitor and the input of the amplifier.

7. The circuit of claim 6, wherein the charge dump circuit further includes:
a second transistor coupled between the first terminal of the capacitor and a first voltage supply terminal; and
a third transistor coupled between the second terminal of the capacitor and a second voltage supply terminal.

8. The circuit of claim 7, wherein the charge dump circuit further includes:
a fourth transistor coupled between the second terminal of the capacitor and a third voltage supply terminal.

9. The circuit of claim 7, wherein the voltage comparator is configured to supply a control signal to control terminals of the first transistor, the second transistor, and the third transistor based on an output voltage at the output of the amplifier and based on a threshold voltage.

10. An electronic system, comprising:
an imaging device configured to provide a signal;
a back-end readout circuit configured to generate a digital signal from an output voltage; and
a circuit coupled between the imaging device and the back-end readout circuit, wherein the circuit is configured to generate the output voltage based on the signal from the imaging device, the circuit comprising:
an amplifier having an input and an output;
a voltage comparator having a first input, a first output, and a second output, the first input of the voltage comparator coupled to the output of the amplifier;
a variable capacitor circuit coupled between the input and the output of the amplifier and coupled to the first output of the voltage comparator, and comprising a first capacitor and a second capacitor coupled in parallel with one another between the input and the output of the amplifier; and
a charge dump circuit having an input and an output, the input of the charge dump circuit coupled to the second output of the voltage comparator, the output of the charge dump circuit coupled to the input of the amplifier.

11. The electronic system of claim 10, wherein the variable capacitor circuit further comprises:
a first switching device coupled between a first terminal of the second capacitor and the input of the amplifier, and having a control terminal coupled to the first output of the voltage comparator;
a second switching device coupled between a second terminal of the second capacitor and the output of the amplifier, and having a control terminal coupled to the first output of the voltage comparator; and
wherein the voltage comparator is configured to provide a first control signal to the control terminals of the first and second switching devices based on a first comparison between the output voltage and a first threshold voltage.

12. The electronic system of claim 11, wherein the voltage comparator is configured to provide a second control signal to the charge dump circuit based on a second comparison between the output voltage and a second threshold voltage.

13. The electronic system of claim 12, wherein the second threshold voltage is greater than the first threshold voltage, and wherein the first comparison is performed before the second comparison.

14. The electronic system of claim 12, wherein the circuit further comprises:
a counter circuit having an input and an output, the input of the counter circuit coupled to a third output of the voltage comparator, the counter circuit configured to generate a counter signal based on a number of times the voltage comparator determines the output voltage is at or below the second threshold voltage; and
a control circuit having a first input and an output, the first input of the control circuit coupled to the output of the counter circuit, the output of the control circuit coupled to a second input of the voltage comparator, the control circuit configured to adjust the second threshold voltage based on the counter signal.

15. The electronic system of claim 14, further comprising:
a clock circuit coupled to a second input of the control circuit or a third input of the voltage comparator, the clock circuit configured to provide a clock signal to the control circuit or the voltage comparator; and
wherein the voltage comparator is configured to generate the second control signal based on the second comparison and the clock signal.

16. The electronic system of claim 15, wherein the charge dump circuit is configured to alter an input charge at the input of the amplifier based on the second control signal, wherein the input charge at the input of the amplifier is altered at a rising edge or a falling edge of the clock signal.

17. The electronic system of claim 10, wherein the voltage comparator comprises:
a first comparator circuit having first and second inputs and an output, the first input of the first comparator circuit coupled to the output of the amplifier, and the second input of the first comparator circuit coupled to a first voltage supply terminal;
a first logic circuit having an input and an output, the input of the first logic circuit coupled to the output of the first comparator circuit, and the output of the first logic circuit coupled to the control terminal of the first switching device;
a second comparator circuit having first and second inputs and an output, the first input of the second comparator circuit coupled to the output of the amplifier, and the output of the second comparator circuit coupled to a second voltage supply terminal; and
a second logic circuit having an input and an output, the input of the second logic circuit coupled to the output of the second comparator circuit, and the output of the second logic circuit coupled to the input of the charge dump circuit.

18. A method, comprising:
receiving an input signal at an amplifier, the input signal having an input charge level;
providing an output voltage from the amplifier based on the input signal;
detecting whether a first voltage drop has occurred by determining whether the output voltage drops below a first threshold voltage;
detecting whether a second voltage drop has occurred by determining whether the output voltage drops below a second threshold voltage after the first voltage drop has occurred, wherein the first threshold voltage is less than the second threshold voltage; and
changing the input charge level of the input signal by a charge value based on whether the second voltage drop has occurred.

19. The method of claim 18, wherein the output voltage increases responsive to changing the input charge level of the input signal by the charge value.

20. The method of claim 18,
providing a clock signal, wherein the input charge level of the input signal is changed by the charge value at a rising edge or a falling edge of the clock signal.

* * * * *